(12) United States Patent
Suwa et al.

(10) Patent No.: US 10,412,847 B2
(45) Date of Patent: Sep. 10, 2019

(54) ELECTRONIC DEVICE MOUNTED TO AN INDUSTRIAL MACHINE

(71) Applicant: FANUC CORPORATION, Yamanashi (JP)

(72) Inventors: Hiroyuki Suwa, Yamanashi-ken (JP); Hideki Okamura, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/051,793

(22) Filed: Aug. 1, 2018

(65) Prior Publication Data

US 2019/0053394 A1 Feb. 14, 2019

(30) Foreign Application Priority Data

Aug. 10, 2017 (JP) .................................. 2017-155709

(51) Int. Cl.
| | |
|---|---|
| *H05K 7/14* | (2006.01) |
| *H05K 5/06* | (2006.01) |
| *F16J 15/06* | (2006.01) |
| *F16J 15/02* | (2006.01) |
| *H05K 5/00* | (2006.01) |
| *F16M 11/04* | (2006.01) |
| *H05K 5/02* | (2006.01) |
| *F16J 15/10* | (2006.01) |

(52) U.S. Cl.
CPC .............. *H05K 7/14* (2013.01); *F16M 11/04* (2013.01); *H05K 5/0017* (2013.01); *H05K 5/0204* (2013.01); *H05K 5/06* (2013.01); *H05K 5/061* (2013.01); *F16J 15/02* (2013.01); *F16J 15/06* (2013.01); *F16J 15/061* (2013.01); *F16J 15/062* (2013.01); *F16J 15/10* (2013.01); *F16J 15/104* (2013.01)

(58) Field of Classification Search
CPC .......... H05K 7/14; H05K 5/06; H05K 5/0204; H05K 5/061; H05K 5/069; F16M 11/04; F16J 15/02; F16J 15/06; F16J 15/061; F16J 15/062; F16J 15/10; F16J 15/104
USPC ................ 277/628, 637, 639, 644, 648–649; 174/50–64
See application file for complete search history.

(56) References Cited

U.S. PATENT DOCUMENTS

| | | | | |
|---|---|---|---|---|
| 8,136,279 | B1 * | 3/2012 | Nearman ............ | B29C 37/0082 277/609 |
| 8,528,264 | B1 * | 9/2013 | Thut ...................... | F16M 13/02 52/27 |

(Continued)

FOREIGN PATENT DOCUMENTS

| | | |
|---|---|---|
| JP | H05-070378 U | 9/1993 |
| JP | H10-032390 A | 2/1998 |

(Continued)

*Primary Examiner* — Zachary Pape
(74) *Attorney, Agent, or Firm* — Robert P. Michal, Esq.; Carter, DeLuca & Farrell LLP

(57) ABSTRACT

An electronic device including an electronic component and mounted to an industrial machine, includes: a casing including an opening; a rear cover configured to close the opening of the casing and form a storage space for accommodating the electronic component between the casing and the rear cover; and a packing integrally formed of an outer seal configured to seal between the rear cover and the industrial machine and an inner seal configured to seal between the rear cover and the casing.

9 Claims, 6 Drawing Sheets

(56) References Cited

U.S. PATENT DOCUMENTS

| | | | | |
|---|---|---|---|---|
| 9,161,462 B2* | 10/2015 | Schwaiger | ............. | H05K 5/061 |
| 9,232,675 B2* | 1/2016 | Schurr | ................ | H05K 5/0017 |
| 2013/0221812 A1 | 8/2013 | Hashimoto et al. | | |

FOREIGN PATENT DOCUMENTS

| JP | 11-251766 A | 9/1999 |
|---|---|---|
| JP | 2008-082994 A | 4/2008 |
| JP | 2009-258489 A | 11/2009 |
| JP | 2013-183195 A | 9/2013 |
| JP | 2014-095777 A | 5/2014 |
| JP | 2015-191193 A | 11/2015 |

* cited by examiner

ELECTRONIC DEVICE MOUNTED TO AN INDUSTRIAL MACHINE

CROSS-REFERENCE TO RELATED APPLICATION

This application is based upon and claims the benefit of priority from Japanese Patent Application No. 2017-155709 filed on Aug. 10, 2017, the contents of which are incorporated herein by reference.

BACKGROUND OF THE INVENTION

Field of the Invention

The present invention relates to an electronic device with an electronic component therein and mounted to an industrial machine.

Description of the Related Art

Japanese Laid-Open Patent Publication No. 2015-191193 discloses a display device in which a packing is provided between a protective panel and an upper case and between the protective panel and a lower case.

SUMMARY OF THE INVENTION

In the technology disclosed in Japanese Laid-Open Patent Publication No. 2015-191193, since no seal is provided between the display device and the member to which the display device is attached, another packing needs to be additionally arranged on the surface of the member to which the display device is mounted, which complicates assembly work.

The present invention has been devised to solve the above problem, and it is therefore an object of the present invention to provide an electronic device mounted to an industrial machine, which can simplify the assembly work when mounted to the industrial machine.

One aspect of the present invention resides in an electronic device including an electronic component and mounted to an industrial machine, which includes: a casing including an opening; a rear cover configured to close the opening of the casing and form a storage space accommodating the electronic component between the casing and the rear cover; and a packing integrally formed of an outer seal configured to seal between the rear cover and the industrial machine and an inner seal configured to seal between the rear cover and the casing.

According to the present invention, it is possible to simplify the assembly work of mounting an electronic device to an industrial machine.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

First Embodiment

[Configuration of Electronic Device]

Figure 1:
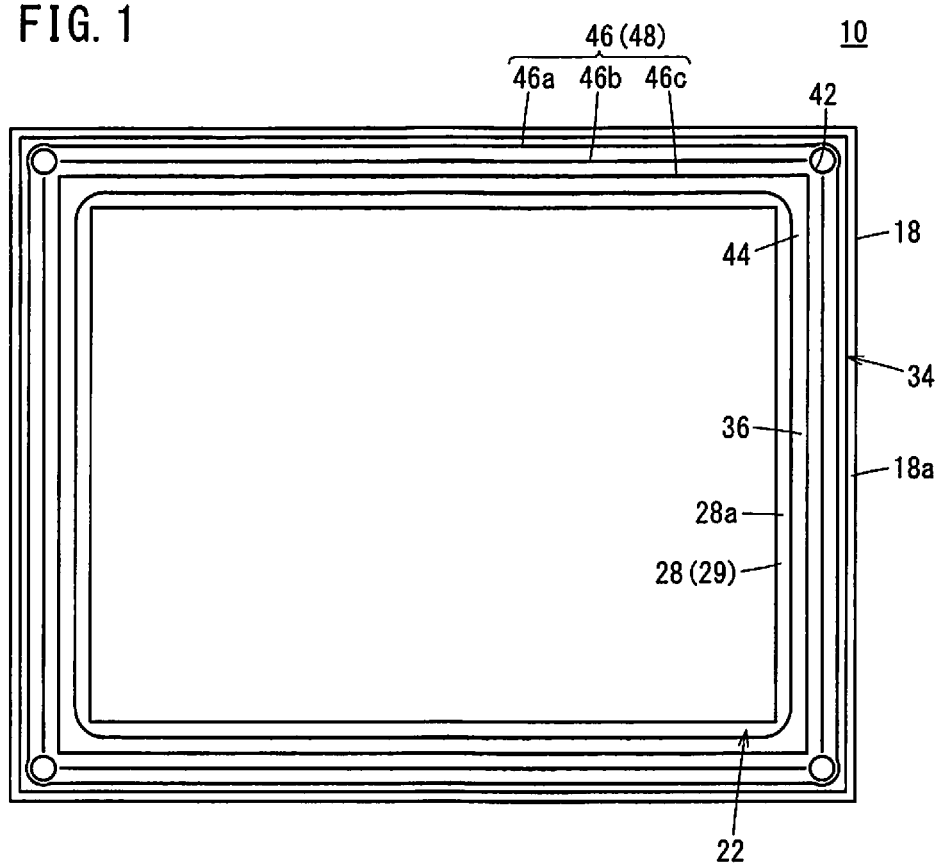
FIG. 1 is a schematic rear view showing an electronic device.
Figure 2:
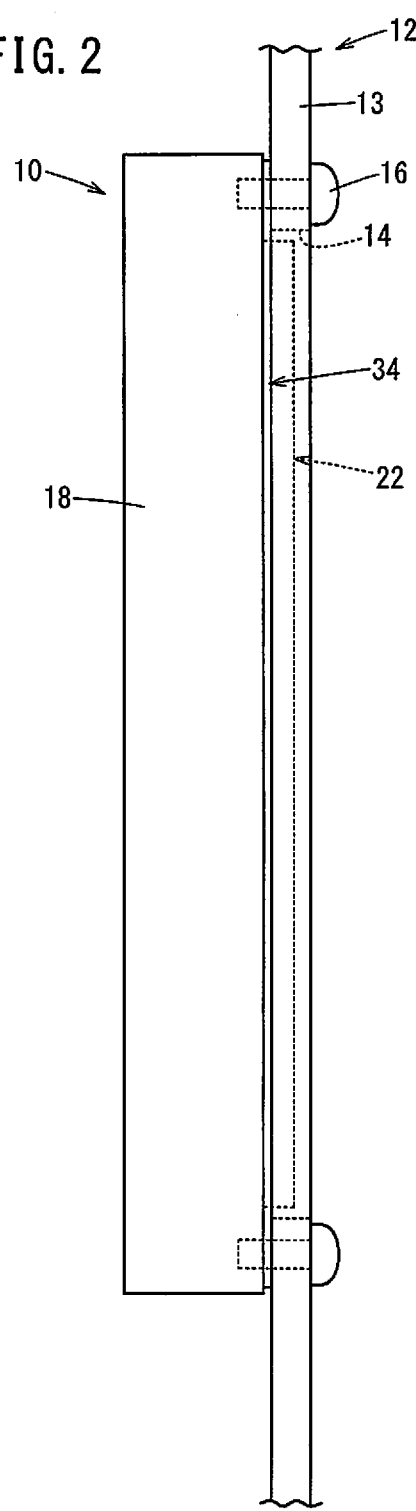
FIG. 2 is a view showing an electronic device in a state in which the device is mounted to a member.
Figure 3:
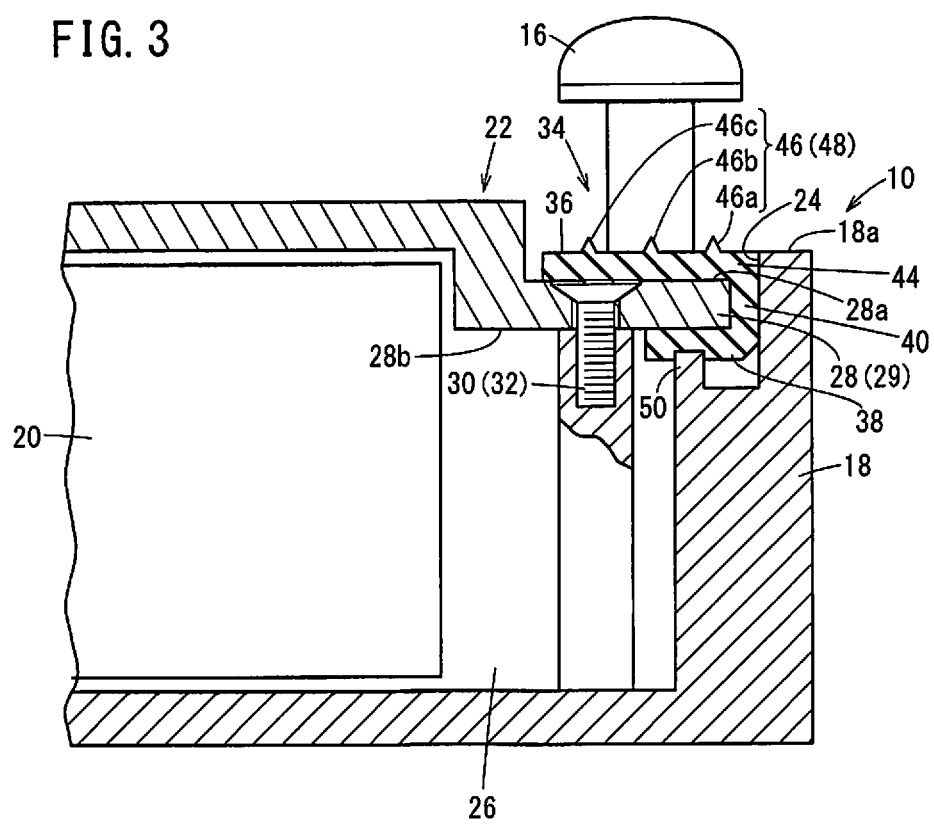
FIG. 3 is a schematic, fragmentary sectional view showing an electronic device.
Figure 4:
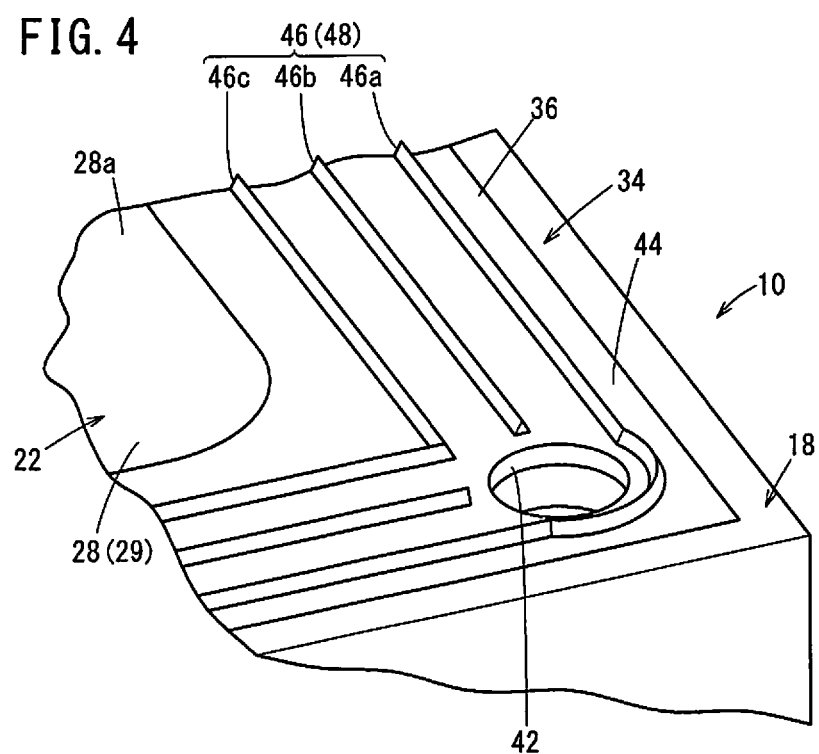
FIG. 4 is a partially enlarged perspective view showing the rear side of an electronic device.

FIG. 1 is a schematic rear view of an electronic device 10. FIG. 2 is a diagram showing a state in which the electronic device 10 is mounted to an industrial machine 12. FIG. 3 is a schematic, fragmentary sectional view showing the electronic device 10. FIG. 4 is a partially enlarged perspective view of the rear side of the electronic device 10.

As shown in FIG. 2, the electronic device 10 of this embodiment is fixed to a housing 13 of the industrial machine 12 by fastening screws 16 at the four corners with part of the electronic device 10 inserted in an opening 14 of the housing 13.

The electronic device 10 has a casing 18, an electronic component 20 and a rear cover 22. The casing 18 has an opening 24, which is closed by the rear cover 22. A storage space 26 is formed between the casing 18 and the rear cover 22 so as to accommodate the electronic component 20 therein.

The rear cover 22 has a flange 28 on its outer periphery. The flange 28 forms an edge, designated at 29. The flange 28 is provided with flat-head screws 30. The head portion of the flat-head screw 30 is exposed to the outside from the flange 28 (the rear cover 22). The flat-head screws 30 fasten the rear cover 22 to the casing 18. The flat-head screws 30 constitute fastening members 32. The flat-head screws 30 do not need to fasten the rear cover 22 and the casing 18. For example, the flat-head screw 30 may fasten the rear cover 22 to an unillustrated member such as a connector. Further, the rear cover 22 and the casing 18 do not need to be fastened by the flat-head screws 30 arranged in the flange 28. For example, the rear cover 22 and the casing 18 may be fastened by a fastening member such as a flat-head screw arranged at the center of the rear cover 22.

The flange 28 has a packing 34 arranged around the entire periphery thereof. The packing 34 is formed of an elastic member such as rubber. The packing 34 has an outer seal 36 for sealing between the flange 28 of the rear cover 22 and the housing 13 when the electronic device 10 is mounted to the housing 13 of the industrial machine 12 and an inner seal 38 for sealing between the flange 28 and the casing 18. The outer seal 36 and the inner seal 38 are joined on their outer peripheral side by a joint seal 40 so that the outer seal 36, the inner seal 38 and the joint seal 40 are integrally formed. As a result, the packing 34 has a Π-shaped (or C-shaped or U-shaped) cross-section with respect to the thickness direction.

The outer seal 36 is provided so as to cover at least part of an outer surface, designated at 28a, of the flange 28 on the side facing the housing 13 of the industrial instrument 12 while the inner seal 38 is provided so as to cover at least part of an inner surface, designated at 28b, of the flange 28 on the side facing the casing 18. Further, the outer seal 36 is disposed so as to cover the heads of the flat-head screws 30 exposed outside the flange 28. The outer seal 36 has through holes 42 through which the screws 16 pass. The screws 16 are screwed into unillustrated screw holes formed in the casing 18.

The packing 34 is given in the form of a frame-like outline and is open between the outer seal 36 and the inner seal 38 on the inner peripheral side and closed between the outer seal 36 and the inner seal 38 by the joint seal 40 on the outer peripheral side. The outer periphery of the packing 34 when it is not attached to the flange 28 of the rear cover 22 has substantially the same shape as, or slightly smaller than, the contour of the flange 28. When the packing 34 is attached on the flange 28, the flange 28 is inserted between the outer seal 36 and the inner seal 38 by stretching the packing 34 so as to be fitted around the whole periphery of the flange 28.

The outer seal 36 is formed of a main part 44 extending inward from the joint seal 40 and ridges 46 formed so as to project from the main part 44 toward the housing 13 of the industrial instrument 12. Each ridge 46 is formed so as to extend along the contour of the flange 28 of the rear cover 22. The ridges 46 include a first ridge 46a, second ridge 46b and third ridge 46c in order from the outer peripheral side. The first ridge 46a, the second ridge 46b and the third ridge 46c each have a substantially triangular cross-section in a state where the packing 34 is cut in the thickness direction (the state shown in FIG. 3). Herein, three ridges 46, including the first ridge 46a, the second ridge 46b and the third ridge 46c, are shown, but the number of the ridges 46 is not particularly limited. Also, the first, second and third ridges 46a, 46b and 46c are not limited to having substantially triangular sections, but may have quadrangular sections.

The ridges 46 are formed so that at least their tops project beyond a surface, designated at 18a, on the rear side of the casing 18 in a state where the electronic device 10 is not mounted to the industrial machine 12. The first ridge 46a and the third ridge 46c are formed continuously around the whole periphery along the contour of the flange 28 of the rear cover 22. The second ridge 46b is formed around substantially whole periphery along the contour of the flange 28 though it is partly disconnected in the areas where through holes 42 are formed. The widths of the first, second and third ridges 46a, 46b and 46c are narrower than that of the main part 44 when the packing 34 is viewed in the cross section with respect to the thickness direction (the state shown in FIG. 3). Therefore, since the contact area of the ridge 46 against the housing 13 of the industrial machine 12 is small, the rigidity of the ridge 46 against the force acting in the direction from the housing 13 to the flange 28 is lower than that of the main part 44. The rigidity of the outer seal 36 against the force acting in the direction from the housing 13 to the flange 28 can be alleviated as a whole by provision of the ridges 46, hence the rigidity of the outer seal 36 can be made lower than that of the inner seal 38. Here, the ridges 46 constitute a low-rigidity portion 48.

The casing 18 is formed with a seal abutment 50 projecting to the rear. The inner seal 38 is pressed against the seal abutment 50 when the rear cover 22 is fixed to the casing 18. When the rear cover 22 is fixed to the casing 18, the inner seal 38 is squeezed between the flange 28 of the rear cover 22 and the seal abutment 50 and comes into close contact with both the flange 28 and the seal abutment 50. As a result, it is possible to establish a tight seal between the rear cover 22 and the casing 18.

The electronic device 10 of the present embodiment is fixed with screws 16 at the four corners to the housing 13 of the industrial machine 12. As a result, there occur cases where the span between the screws 16 of the electronic device 10 is curved so that the flange 28 of the rear cover 22 partially floats from the housing 13. Since the ridges 46 of the outer seal 36 have a lower rigidity than the main part 44, the ridges 46 are crushed and greatly deformed around the screws 16 when the electronic device 10 is fixed to the housing 13 with the screws 16, so that the screws 16 can be pushed in. On the other hand, the middle part of the ridges 46 between the screws 16 is less deformed than the ridges 46 near the screws 16. As a result, even if part of the flange 28 of the rear cover 22 floats from the housing 13, the outer seal 36 can create hermetic contact with the flange 28. That is, the outer seal 36 can be deformed into a shape filling the gap between the electronic device 10 and the industrial machine 12 to create hermetic contact with both the flange 28 of the rear cover 22 and the housing 13, whereby it is possible to secure a tight seal between the rear cover 22 and the industrial machine 12.

In the above description, the ridges 46 are formed so as to protrude from the main part 44 toward the housing 13 side, but the ridges 46 may be formed so as to protrude from the main part 44 toward the flange 28 side.

[Operation and Effect]

When a device like the electronic device 10 of this embodiment is mounted to the industrial machine 12, the device needs to have an inner seal for preventing liquid or the like from entering the interior of the electronic device 10 and an outer seal for preventing liquid or the like from entering the interior of industrial machine 12 from between the electronic device 10 and the housing 13 of the industrial machine 12. Conventionally, the inner seal and the outer seal have been provided separately so that the assembling work of the electronic device 10 has been troublesome.

To deal with this, in the present embodiment, the outer seal 36 for sealing between the flange 28 of the rear cover 22 and the housing 13, and the inner seal 38 for sealing between the flange 28 and the casing 18, are integrally formed to provide the packing 34. Thus, the packing 34 having an integrated structure can prevent liquid or the like from entering the interior of the electronic device 10 and prevent liquid or the like from entering the inside of the industrial machine 12 from between the electronic device 10 and the housing 13. Therefore, it is possible to simplify the assembling work of the electronic device 10.

Further, in the present embodiment, the packing 34 is formed so that its cross section with respect to the thickness direction is Π-shaped to cover the outer surface 28a and the inner surface 28b of the flange 28 of the rear cover 22. As a result, the packing 34 can be fitted from the outer peripheral side of the flange 28 and set to the rear cover 22.

Further, in the present embodiment, the packing 34 is applied on the flange 28 of the rear cover 22 around the whole periphery along the outer peripheral shape. As a result, it is possible to seal both the entire periphery between the flange 28 and the casing 18 and the entire periphery between the flange 28 and the housing 13 of the industrial machine 12.

As described above, there occur cases where the span between the screws 16 of the electronic device 10 is curved so that the flange 28 of the rear cover 22 partially floats from the housing 13 of the industrial machine 12. To deal with this, it is necessary to hermetically seal the portion where the flange 28 floats from the housing 13 by the thickened outer seal 36. However, when the outer seal 36 is formed to be thick, it is necessary to make the outer seal 36 relatively low in rigidity so that the screws 16 can be pushed in. On the other hand, since the packing 34 is fitted over the whole periphery of the flange 28 by inserting the flange 28 of the rear cover 22 between the outer seal 36 and the inner seal 38, the total rigidity of the packing 34 needs to be secured to some extent so as to keep the shape of the packing 34 itself.

For this purpose, in the present embodiment, the side of the outer seal 36, which is in contact with the housing 13 of the industrial machine 12, is formed to be lower in rigidity against the force acting in the direction from the housing 13 toward the rear cover 22, than the other portion of the packing 34. As a result, even if the outer seal 36 is formed to be thick, the outer seal 36 can be deformed into a shape filling the gap between the flange 28 and the housing 13 so as to create a tight seal between the rear cover 22 and the housing 13. Further, since the rigidity of the packing 34 as a whole can be secured, the shape of the packing 34 can be maintained.

Further, in the present embodiment, the outer seal 36 is formed of the main part 44 extending inward from the joint seal 40 and the ridges 46 formed so as to be raised along the contour of the flange 28 of the rear cover 22 and projected from the main part 44 toward the housing 13 of the industrial instrument 12. As a result, it is possible to reduce the rigidity of the outer seal 36 against a force acting in a direction from the housing 13 to the rear cover 22 without using different materials for the outer seal 36 and the inner seal 38.

In the present embodiment, the ridges 46 are formed around the whole periphery along the contour of the flange 28 of the rear cover 22. This makes it possible to suppress infiltration of liquid or the like from between the rear cover 22 and the housing 13 of the industrial machine 12.

Moreover, in the present embodiment, the outer seal 36 is provided so as to cover the heads of the flat-head screws 30 provided in the rear cover 22. As a result, it is possible to suppress infiltration of liquid or the like into the electronic device 10 through the screw holes of the flat-head screws 30.

Second Embodiment

[Configuration of Packing]

Figure 5:
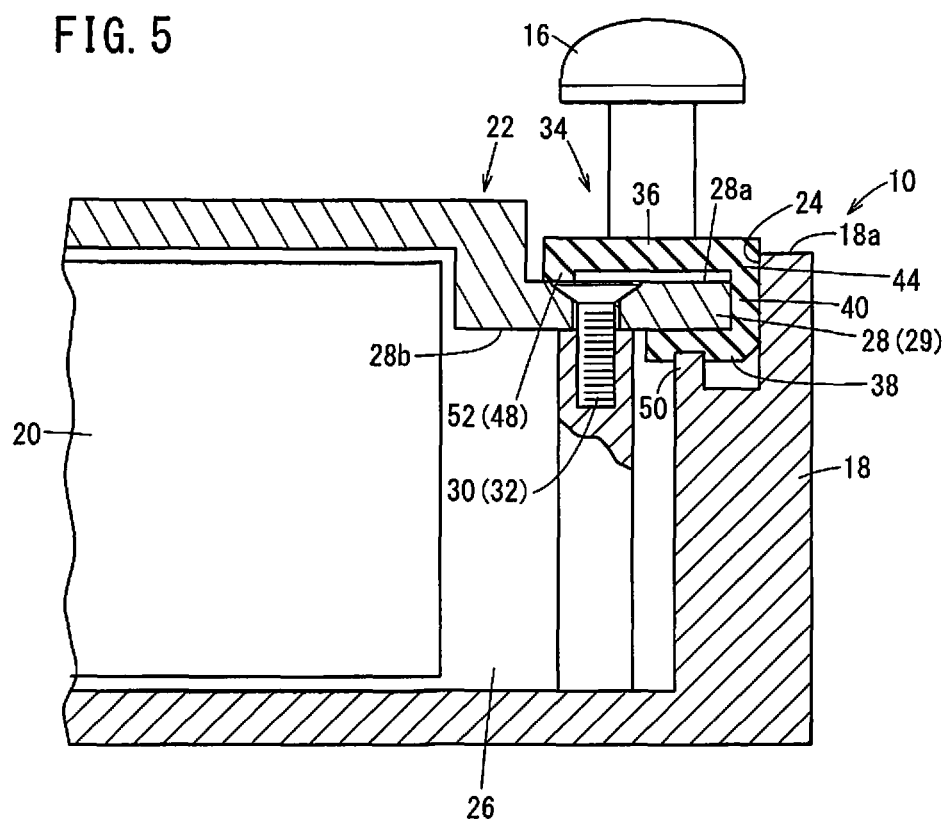
FIG. 5 is a schematic, fragmentary sectional view showing an electronic device.

FIG. 5 is a schematic, fragmentary sectional view showing an electronic device 10. Similarly to the first embodiment, a packing 34 has an outer seal 36 for sealing between a flange 28 of a rear cover 22 and a housing 13 of an industrial machine 12 when the electronic device 10 is mounted to the industrial machine 12 and an inner seal 38 for sealing between the flange 28 and a casing 18. The outer seal 36 and the inner seal 38 are joined on their outer peripheral side by a joint seal 40 so that the outer seal 36, the inner seal 38 and the joint seal 40 are integrally formed.

The outer seal 36 is formed of a main part 44 extending inward from the joint seal 40 and a ridge 52 formed so as to project from the main part 44 toward the flange 28 side of the rear cover 22. This ridge 52 keeps the main part 44 separated from the flange 28 while the main part 44 is formed so that at least part of the main part 44 projects beyond a surface, designated at 18a, of the rear side of the casing 18 in a state where the electronic device 10 is not mounted to the industrial machine 12. Here, the shape of the ridge 52 is not particularly limited as long as the main part 44 can be spaced from the flange 28. The ridge 52 is formed continuously around the whole periphery along the contour of the flange 28 of the rear cover 22.

The width of the ridge 52 is narrower than that of the main part 44 when the packing 34 is viewed in the cross section with respect to the thickness direction (the state shown in FIG. 5). Therefore, since the contact area of the ridge 52 against the flange 28 is small, the rigidity of the ridge 52 against the force acting in the direction from the housing 13 of the industrial machine 12 to the flange 28 is lower than that of the main part 44. The rigidity of the outer seal 36 against the force acting in the direction from the housing 13 to the rear cover 22 can be alleviated as a whole by provision of the ridge 52, and hence the rigidity of the outer seal 36 can be made lower than that of the inner seal 38. Here, the ridge 52 constitutes a low-rigidity portion 48.

Since the ridge 52 of the outer seal 36 has a lower rigidity than the main part 44, the ridge 52 is crushed and greatly deformed around the screws 16 when the electronic device 10 is fixed to the housing 13 of the industrial machine 12 with the screws 16, so that the screws 16 can be pushed in. On the other hand, the middle part of the ridge 52 between the screws 16 is less deformed than the ridge 52 near the screws 16. As a result, even if part of the flange 28 of the rear cover 22 floats from the housing 13, the outer seal 36 can create hermetic contact with the flange 28. That is, the outer seal 36 can be deformed into a shape filling the gap between the electronic device 10 and the industrial machine 12 to create hermetic contact with both the flange 28 of the rear cover 22 and the housing 13, whereby it is possible to secure a tight seal between the rear cover 22 and the industrial machine 12.

[Operation and Effect]

In the present embodiment, the outer seal 36 is formed of the main part 44 extending inward from the joint seal 40 and the ridge 52 projecting from the main part 44 toward the flange 28 of the rear cover 22. This configuration makes it possible to reduce the rigidity of the outer seal 36 against the force acting in the direction from the industrial machine 12 toward the rear cover 22 without using different materials for the outer seal 36 and the inner seal 38.

Third Embodiment

[Configuration of Packing]

Figure 6:
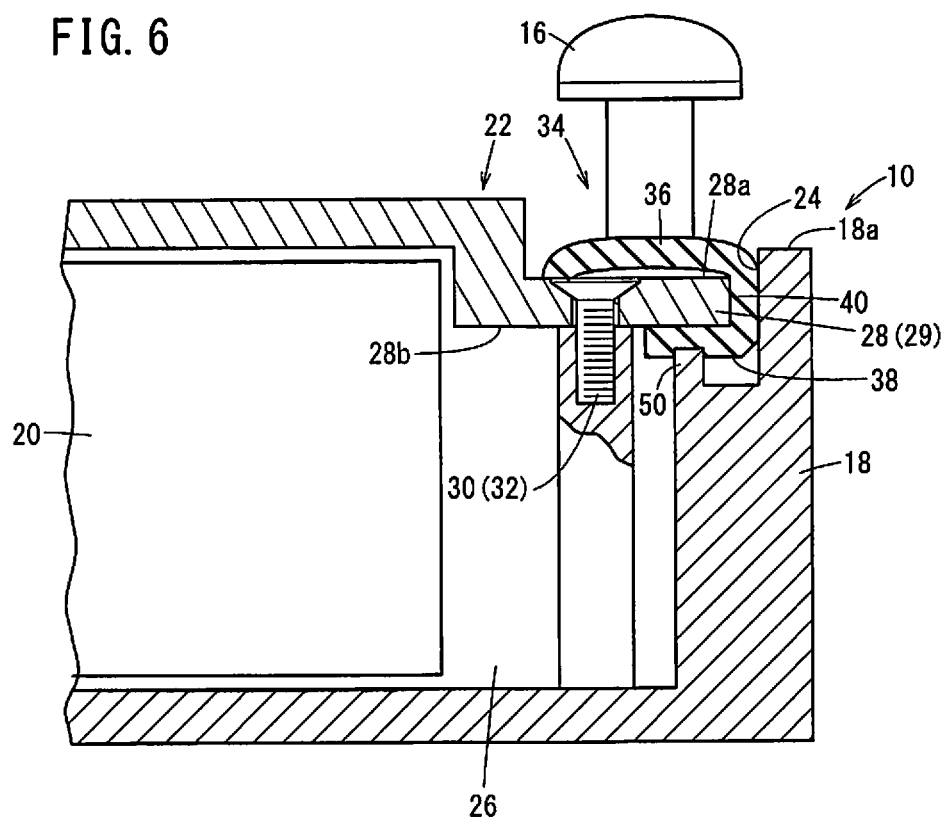
FIG. 6 is a schematic, fragmentary sectional view showing an electronic device.

FIG. 6 is a schematic, fragmentary sectional view showing an electronic device 10. Similarly to the first embodiment, a packing 34 has an outer seal 36 for sealing between the flange 28 of a rear cover 22 and a housing 13 of an industrial machine 12 when the electronic device 10 is mounted to the industrial machine 12 and an inner seal 38 for sealing between the flange 28 and a casing 18. The outer seal 36 and the inner seal 38 are joined on their outer peripheral side by a joint seal 40 so that the outer seal 36, the inner seal 38 and the joint seal 40 are integrally formed.

The outer seal 36 is formed so that at least part of its side facing the flange 28 of the rear cover 22 is kept apart from the flange 28, creating a void between the outer seal 36 and the flange 28. Further, the outer seal 36 is formed so that at least part thereof is projected beyond a surface, designated at 18a, on the rear side of the casing 18.

Since there is a void between the outer seal 36 and the flange 28, the outer seal 36 is more likely to deform as compared with a case where the outer seal 36 is totally in contact with the flange 28. When the electronic device 10 is fixed to the housing 13 of the industrial machine 12 with the screws 16, the outer seal 36 around the screws 16 is crushed and greatly deformed so that the screws 16 can be pushed in. On the other hand, the middle area of the outer seal 36 between the screws 16 is less deformed than the outer seal 36 near the screws 16. As a result, even if part of the flange 28 of the rear cover 22 floats from the housing 13, the outer seal 36 can create hermetic contact with the flange 28. That is, the outer seal 36 can be deformed into a shape filling the gap between the electronic device 10 and the industrial machine 12 to create hermetic contact with both the flange 28 of the rear cover 22 and the housing 13, whereby it is possible to secure a tight seal between the rear cover 22 and the industrial machine 12.

[Operation and Effect]

In the present embodiment, the outer seal 36 is formed so as to create a void between the outer seal 36 and the flange 28 of the rear cover 22. The outer seal 36 is easily deformed as compared with the case where the outer seal 36 is totally in contact with the flange 28. This arrangement makes it possible to reduce the rigidity of the outer seal 36 against the force acting in the direction from the industrial machine 12 toward the rear cover 22 without using different materials for the outer seal 36 and the inner seal 38.

Technical Ideas Obtained from Embodiment

Technical ideas that can be grasped from the above embodiment will be described below.

The electronic device (10) includes the electronic component (20) and is mounted to the industrial machine (12). The electronic device (10) includes: the casing (18) including the opening (24); the rear cover (22) configured to close the opening (24) of the casing (18) and form the storage space (26) accommodating the electronic component (20) between the casing (18) and the rear cover; and the packing (34) integrally formed of the outer seal (36) configured to seal between the rear cover (22) and the industrial machine (12) and the inner seal (38) configured to seal between the rear cover (22) and the casing (18). Thus, it is possible to simplify the assembling work of the electronic device (10).

In the above electronic device (10) mounted to the industrial machine (12), the packing (34) may be configured to have a Π-shaped cross-section so as to cover the outer and inner surfaces of the edge (29) of the rear cover (22). This configuration enables the packing (34) to be set to the rear cover (22) by fitting from the outer peripheral side of the edge (29) of the rear cover (22).

In the above electronic device (10) mounted to the industrial machine (12), the packing (34) may be provided around the whole periphery along the edge of the rear cover (22). This configuration makes it possible to seal between the rear cover (22) and the casing (18) around the whole periphery and seal between the rear cover (22) and the industrial machine (12) around the whole periphery.

In the above electronic device (10) mounted to the industrial machine (12), the outer seal (36) may include the main part (44) extending from a joint portion connected to the inner seal (38) and the low-rigidity portion (48) having a lower rigidity than that of the main part (44). As a result, even if the outer seal (36) is formed to be thick, the outer seal (36) can be deformed into a shape filling the gap between the rear cover (22) and the industrial machine (12) so as to create a tight seal between the rear cover (22) and industrial machine (12). Further, since the rigidity of the packing (34) as a whole can be secured, the shape of the packing (34) can be maintained.

In the above electronic device (10) mounted to the industrial machine (12), the outer seal (36) may include the ridge (46) projected from the main part (44) toward the industrial machine (12), forming the low-rigidity portion (48). Thus, without using different materials for the outer seal (36) and the inner seal (38), the rigidity of the outer seal (36) against the force in the direction from the industrial machine (12) to the rear cover (22) can be lowered.

In the above electronic device (10) mounted to the industrial machine (12), the outer seal (36) may include the ridge (52) projected from the main part (44) toward the rear cover (22), forming the low-rigidity portion (48). Thus, without using different materials for the outer seal (36) and the inner seal (38), the rigidity of the outer seal (36) against the force in the direction from the industrial machine (12) to the rear cover (22) can be lowered.

In the above electronic device (10) mounted to the industrial machine (12), the ridge (46, 52) may be continuously formed along the edge around the whole periphery of the rear cover (22). As a result, infiltration of liquid or the like from between the rear cover (22) and the industrial machine (12) can be suppressed.

In the above electronic device (10) mounted to the industrial machine (12), the outer seal may form a void between the outer seal (36) and the rear cover (22). Thereby, without using different materials for the outer seal (36) and the inner seal (38), the rigidity of the outer seal (36) against the force in the direction from the industrial machine (12) to the rear cover (22) can be lowered.

The above electronic device (10) mounted to the industrial machine (12) may further include the fastening member (32) configured to fasten the rear cover (22) and a member. The outer seal (36) may be provided so as to cover the head portion of the fastening member (32) exposed outside the rear cover (22). As a result, it is possible to suppress infiltration of liquid or the like into the industrial machine (12) through the insertion hole of the fastening member (32).

The present invention is not limited to the embodiments described above, and it goes without saying that the embodiments can be freely modified within a range that does not deviate from the essence and gist of the present invention as set forth in the appended claims.

What is claimed is:

1. An electronic device including an electronic component and mounted to an industrial machine, comprising:
    a casing including an opening;
    a rear cover disposed within a portion of the opening of the casing and configured to close the opening and form a storage space accommodating the electronic component between the casing and the rear cover; and
    a packing disposed within a portion of the opening of the casing, the packing integrally formed of an outer seal configured to seal between the rear cover and the industrial machine and an inner seal configured to seal between the rear cover and the casing,
    wherein
    the outer seal includes
        a main part extending from a joint portion connected to the inner seal and
        a low-rigidity portion having a lower rigidity than that of the main part, and
    the low-rigidity portion is provided for a first face of the main body of the packing, the first face being located on the industrial machine side, or is provided for a second face of the main body of the packing, the second face located on the opposite side of the main body from the industrial machine side.

2. The electronic device mounted to the industrial machine according to claim 1, wherein the packing is configured to have a Π-shaped cross-section so as to cover outer and inner surfaces of an edge of the rear cover.

3. The electronic device mounted to the industrial machine according to claim 1, wherein the packing is provided around a whole periphery along an edge of the rear cover.

4. The electronic device mounted to the industrial machine according to claim 1, wherein the outer seal includes a ridge projected from the main part toward the industrial machine, forming the low-rigidity portion.

5. The electronic device mounted to the industrial machine according to claim 1, wherein the outer seal includes a ridge projected from the main part toward the rear cover, forming the low-rigidity portion.

6. The electronic device mounted to the industrial machine according to claim 4, wherein the ridge is continuously formed along the edge around a whole periphery of the rear cover.

7. The electronic device mounted to the industrial machine according to claim 1, further comprising a fastening member configured to fasten the rear cover and a member, wherein the outer seal is provided so as to cover a head portion of the fastening member exposed outside the rear cover.

8. An electronic device including an electronic component and mounted to an industrial machine, comprising:
   a casing including an opening;
   a rear cover configured to close the opening of the casing and form a storage space accommodating the electronic component between the casing and the rear cover; and
   a packing integrally formed of an outer seal configured to seal between the rear cover and the industrial machine and an inner seal configured to seal between the rear cover and the casing,
   wherein the outer seal includes a main part extending from a joint portion connected to the inner seal and a low-rigidity portion having a lower rigidity than that of the main part.

9. An electronic device including an electronic component and mounted to an industrial machine, comprising:
   a casing including an opening;
   a rear cover configured to close the opening of the casing and form a storage space accommodating the electronic component between the casing and the rear cover;
   a packing integrally formed of an outer seal configured to seal between the rear cover and the industrial machine and an inner seal configured to seal between the rear cover and the casing; and
   a fastening member configured to fasten the rear cover and a member, wherein the outer seal is provided so as to cover a head portion of the fastening member exposed outside the rear cover.

* * * * *